United States Patent [19]

Rebeles

[11] 3,895,306

[45] July 15, 1975

[54] SELF-BALANCING PUSH-PULL AMPLIFIER

[75] Inventor: Paul L. Rebeles, Hermosa Beach, Calif.

[73] Assignee: TRW Inc., Los Angeles, Calif.

[22] Filed: May 29, 1973

[21] Appl. No.: 364,556

[52] U.S. Cl. ........................ 330/15; 330/20; 330/25; 330/26

[51] Int. Cl. ............................................. H03f 3/26

[58] Field of Search .................... 330/15, 20, 26, 25

[56] References Cited

UNITED STATES PATENTS

| | | | |
|---|---|---|---|
| 2,835,748 | 5/1958 | Ensink et al. | 330/15 X |
| 3,434,067 | 3/1969 | Eckelmann, Jr. | 330/15 |

*Primary Examiner*—R. V. Rolinec
*Assistant Examiner*—Lawrence J. Dahl

[57] ABSTRACT

A push-pull amplifier with exceptionally low second order distortion products is disclosed. The amplifier comprises a push-pull stage with a feedback loop which feeds back to the input any common mode components in the output signal, that is, any components in the output of the two halves of the push-pull stage which are in phase. The feedback is degenerative in that it is fed to both halves of the push-pull stage, in phase, so as to reduce the common mode output voltage. An embodiment utilizing a cascode amplifier for each half of the push-pull stage is disclosed. The bases of the common base connected transistors in each cascode half are joined and serve as the source for the feedback signal.

11 Claims, 2 Drawing Figures

SELF-BALANCING PUSH-PULL AMPLIFIER

BACKGROUND OF THE INVENTION

1. Field of the Invention

This invention relates to feedback push-pull amplifiers.

2. Prior Art

In the original assignment of frequencies for television channels much thought was given to the particular frequencies assigned for the purpose of assuring that distortion products generated by non-linear amplification would not result in the generation of signals within the pass band of any selected channel. With the advent of CATV, however, the need for additional channels resulted in the assignment of new channels having frequencies which, if non-linearities in amplification are present, will cause interfering signals to appear on some channels. This interference is largely caused by even order distortion products occasioned by the non-linearity of the amplifying system.

The usual method of reducing even order distortion products is to use two identical Class A amplifiers, transformer coupled, in such fashion that the two amplifiers are simultaneously amplifying the same signal, except that the signal polarity in one amplifier is the opposite at any moment in time as the signal in the other, or the amplifier outputs being summed. In other words, a push-pull amplifier is used. The efficacy of push-pull amplification in reducing even order distortion products is well known and need not be further described.

For many applications, this method is satisfactory, but even order distortion products in a CATV system creates more than the usual level of problems. A CATV distribution system comprises one or more long lines strung through the area to be served with each consumer tapping off the line as it passes his property. Line losses and consumer loading requires that broad band booster amplifiers be inserted in the distribution line at relatively frequent intervals. The distortion generated in each booster amplifier is amplified by each successive amplifier with the result that unless each booster amplifier is exceptionally linear, objectionable interferences will be present at the end of the line.

Ordinary push-pull amplifiers can be made sufficiently linear to achieve the low level distortion required, but in order to do so, the components in each amplifier must be closely matched and special attention to alignment of the amplifier must be taken. If there is any difference in gain or phase shift between the two halves of the push-pull amplifier, the desired even harmonic suppression will not be obtained.

In the present invention the difference in the absolute outputs of the two halves of a push-pull amplifier is fed back to the input in such a manner as to reduce the gain of the side having the most gain and to increase the gain of the side with the least gain thereby making the gains of the two halves of the push-pull stage the same and realizing the full even harmonic reduction of which the amplifier is capable, without expensive and time-consuming matching and alignment.

SUMMARY OF THE INVENTION

The transfer characteristic of a normal well designed Class A amplifier stage in general is slightly non-linear having a small unidirectional curvature in the region of operation. Two identical stages connected in push-pull will not generate even order distortion products since the distortion generated in one half of the push-pull stage will be cancelled by an equal and opposite distortion product in the other half. Such cancellation is well known in the art but the effectiveness depends upon the transfer characteristics of each half being identical. Normal variations in resistances and device characteristics generally result in some unbalance so that the transfer characteristics of each half of a production push-pull amplifier are not identical and, to the extent that they differ, complete even order distortion product cancellation is not achieved. It has been observed that one of the most important factors in the generation of harmonics in an amplifier is the output level, the higher the output level, the higher the distortion. In a push-pull amplifier, the two halves of the amplifier are fed from the same source so that the effect manifests itself as a function of the gain of each half of the amplifier. Thus if two nominally similar amplifier stages connected in push-pull are adjusted, somehow, so that their individual gains are identical, their individual transfer characteristics will be almost identical leading to almost complete cancellation of even order distortion products for the stage. To the extent that the gains of the individual halves differ, the even order distortion of the push-pull stage will increase.

The invented amplifier uses a feedback loop which detects differences in the output of the two halves of a push-pull amplifier and is positive with respect to the half with lower gain and negative with respect to the half with higher gain so as to result in the two halves having the same gain with consequent even order distortion cancellation.

A particular embodiment of the invented amplifier, which has been found useful as a CATV broad band booster amplifier comprises two class A cascode amplifiers connected in push-pull. The bases of the emitter driven transistors are connected together and a feedback signal from this point is fed to both input bases simultaneously. This connection results in the gain of each half of the push-pull stage being automatically raised or lowered as necesssary to make the gains identical.

DETAILED DESCRIPTION OF THE INVENTION

Figure 1:
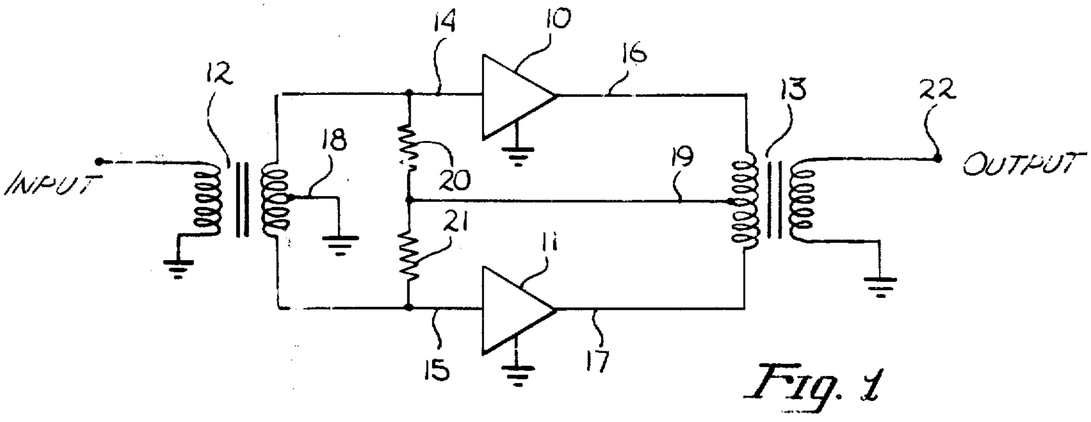
FIG. 1 is a schematic diagram of one embodiment of the invented amplifier.

Referring first to FIG. 1 where one embodiment of the present invention is shown in schematic form. Only signal paths are shown in the diagram, the power supply connections and required isolation therefrom being well known and conventional. A pair of nominally identical amplifier stages 10 and 11 are shown connected in push-pull using an input transformer 12 and an output transformer 13. The amplifier stages are inverting, that is a positive signal at their inputs 14 and 15 will result in a negative signal at their outputs 16 and 17. Non-inverting stages could be used, if desired, but some signal inverting device, such as for example a properly connected transformer, would have to be inserted in the feedback loop to establish the proper phase relationships around the loop. Such phase adjusting devices are well known in the art and need not be discussed here in detail.

A signal impressed at the input of transformer 12 will appear at inputs 14 and 15 of amplifiers 10 and 11 at the same amplitude but 180° out of phase. For convenience in explanation, point 18 is shown grounded and thus becomes the reference to which other circuit voltages are related.

If the gains of amplifiers 10 and 11 are identical, amplified signals which are equal and opposite will appear at the amplifier outputs 16 and 17. So long as the signals on lines 16 and 17 are equal and opposite no voltage will appear at 19, the center tap of the output transformer. If, however, the gain of amplifier 10 is less than that of amplifier 11, the voltages will not be equal and opposite but a voltage will appear at point 19 which is in phase with the voltage on line 17. The opposite would of course be true, if amplifier 10 had the higher gain.

As will be realized by those skilled in the art, the voltage appearing across the primary winding of transformer 13 is the algebraic difference of the outputs of the amplifiers 10 and 11 while the voltage appearing at the center tap 19 is functionally related to the sum of the outputs, that is it is equal to one half the algebraic sum of the outputs of amplifier 10 and amplifier 11.

Assuming the first case, amplifier 11 having higher gain, the voltage at center tap 19 is coupled back to amplifier inputs 14 and 15 through resistors 20 and 21 with the feedback voltage at input 14 being in phase with the signal from transformer 12 and the feedback to input 15 being out of phase. The positive feedback to amplifier 10 tends to increase the voltage at output 16 and the negative feedback to amplifier 11 tends to reduce its output at 17. The net result is that the voltage output of amplifiers 10 and 11 become substantially equal thereby generating substantially equal amounts of harmonic distortion, the even order components of which will be in phase instead of 180° out of phase. This is true because the time required for one half cycle of any signal is identically equal to the time of a full cycle of its second harmonic and a multiple of full cycles for higher order even harmonics. Consequently, if two identical signals have a 180° phase relationship, the even harmonic components in the signals will be in phase.

Thus outputs 16 and 17 of amplifiers 10 and 11, being 180° apart at the fundamental of the signal impressed on input transformer 12, are additive in output transformer so as to cause a large output at output terminal 22, but the even harmonic components of the signals at 16 and 17 are in phase and of substantially equal amplitude so that they result in no voltage across the primary of output transformer 13 and thus no output at 22.

It will be appreciated that the amplifiers 10 and 11, shown symbolically in FIG. 1 can be any manner of amplifier, vacuum tube, transistor, single or multi-stage.

Figure 2:
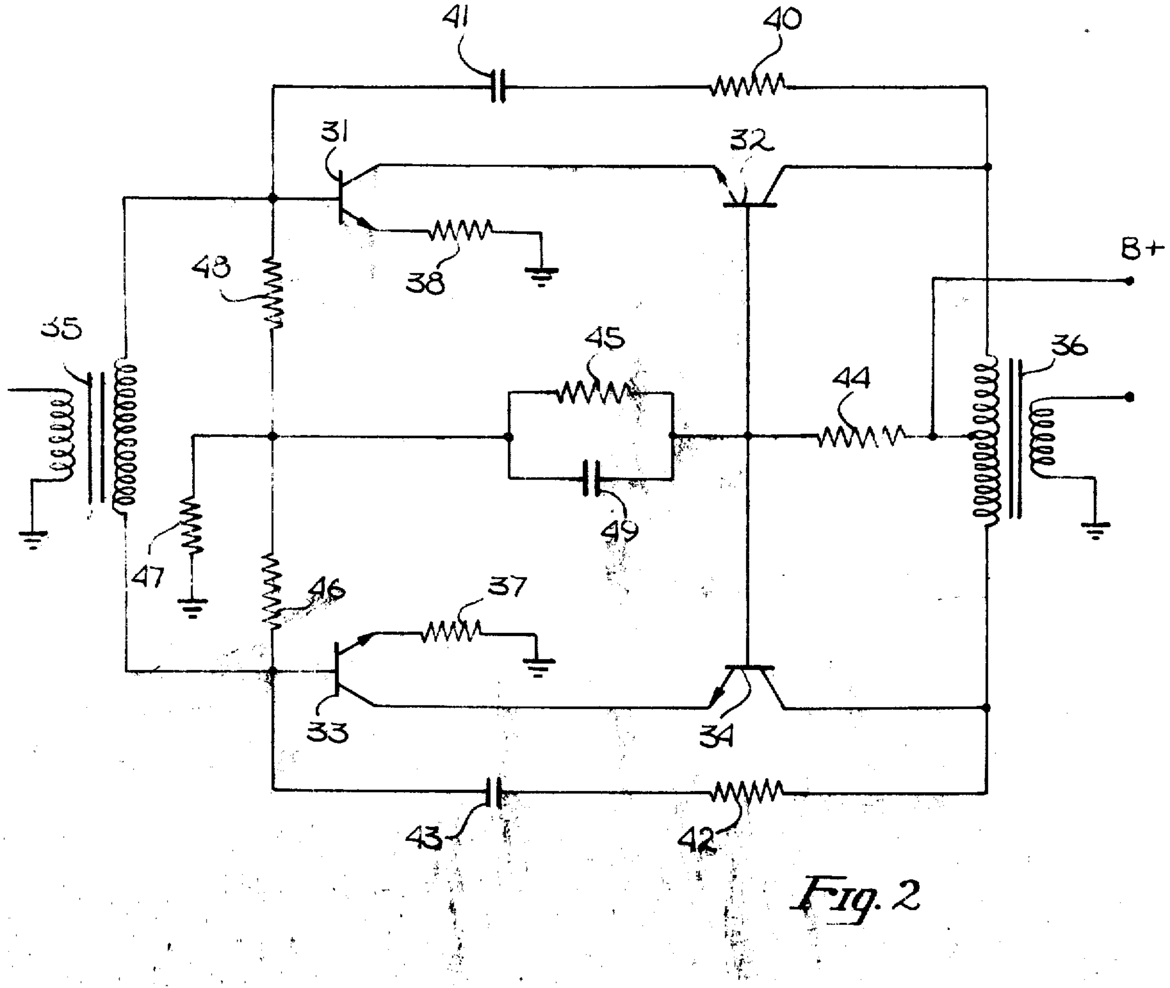
FIG. 2 is a schematic diagram of a second embodiment of the invented amplifier.

A second embodiment of the present invention, presented in somewhat greater detail is schematically shown in FIG. 2. Here two cascode amplifiers comprised of transistors 31 and 32, and 33 and 34 are connected in push-pull with input transformer 35 and output transformer 36. Resistors 37 and 38 provide some negative feedback in each amplifier section as do the networks resistor 40 with capacitor 41 and resistor 42 with capacitor 43. The purpose of these feedback elements is to linearize the amplifier sections and flatten the frequency response. Their inclusion is not a part of the present invention, but such elements represent good engineering design practice. Resistors 44, 45, 46, 47 and 48 are selected to supply the correct DC bias potentials to the transistor elements for proper amplifier performance. The bases of the emitter driven transistors, 32 and 34, are connected together and to the junction of resistors 44 and 45. With respect to the signal being amplified, this connection is the equivalent to bypassing the bases to ground, as is done in the usual cascode amplifier. This is because the signals appearing at these bases have a 180° phase relationship and cancel each other. Even order harmonic distortion products, however, do not have a 180° phase relationship, as explained above, but are in phase. Such distortion products appear at the junction of resistor 44 and the network of resistor 45 and capacitor 49.

In operation, the circuit of the embodiment shown in FIG. 2 functions in the same manner as does the embodiment of FIG. 1. Input transformer 35 applies equal and opposite signals to the bases of transistors 31 and 33 which function as common emitter amplifiers. The outputs developed in the collector circuits are fed to the emitters of transistors 32 and 34 which are connected in the common base configuration with the outputs being developed across the output transformer 36. To the extent that the two cascode amplifiers are identical and have identical gains, any even harmonic distortion generated by the two amplifiers will cancel in output transformer 36.

As has been previously explained, the harmonic distortion produced by an amplifier is related to the output of the amplifier, the distortion created by two nominally identical amplifiers being nearly identical when the fundamental outputs of the two amplifiers are of the same amplitude.

Any difference in output between the amplifier section including transistors 31 and 32 from the section including transistors 33 and 34 will manifest itself in a voltage at the junction of the bases of transistors 32 and 34. This voltage will be fed back to the bases of transistors 31 and 33 through capacitor 49, resistor 45 and resistors 46 and 48. The voltage will be in phase with respect to the amplifier which had the lower output and out of phase with respect to the amplifier which had the higher output and thereby, if the feedback is sufficiently high, the two amplifier outputs will be equalized. Each half of the push-pull stage having substantially the same output results in substantially the same harmonic distortion in each half which in turn results in even harmonic cancellation and a very low distortion output.

As an example of the even order distortion reduction achievable with the invented circuit, measurements have been made on a typical amplifier having the circuit of FIG. 2. Total second order distortion products with three input frequencies (CATV channels 2, 13 and R) are shown in Table I for the conditions with and without feedback capacitor 49. The values of the components in the feedback circuit at the time of the measurement were:

| | | |
|---|---|---|
| Resistor 44 | — | 750 ohms |
| Resistor 45 | — | 530 ohms |
| Resistor 46 | — | 220 ohms |
| Resistor 47 | — | 370 ohms |
| Resistor 48 | — | 220 ohms |
| Capacitor 49 | — | .01 mfd |

TABLE 1

| | SECOND ORDER DISTORTION (DB BELOW + 50 dhm V) | | |
|---|---|---|---|
| CHANNEL | 2 | 13 | R |
| FREQ (MHZ) | 55.25 | 211.25 | 266.85 |
| CAPACITOR 49 OMITTED | −78 | −72 | −66 |
| CAPACITOR 49 INCLUDED | −78 | −80 | −74 |

It can be seen from an inspection of Table 1 that substantial reduction in second order distortion was achieved on channels 13 and R but that the amplifier was well balanced initially on channel 2 and thus no improvement was noted. This result points up one of the shortcomings of the prior art amplifiers with respect to lowering distortion of a wide band amplifier. While, even though expensive and difficult, an amplifier can be balanced to produce minimum distortion at a particular frequency, the balance required is frequency sensitive so that minimum distortion cannot be achieved on a broad band basis.

The same amplifier on which the data of Table 1 was taken was then modified to intentionally unbalance it so as to stimulate an amplifier wherein the tolerances on the components are additive. Resistor 48 was increased in value to 250 ohms. The results under this condition are shown in Table 2.

TABLE 2

| | SECOND ORDER DISTORTION (DB BELOW + 50 dbm V) | | |
|---|---|---|---|
| CHANNEL | 2 | 13 | R |
| FREQ (MHZ) | 55.25 | 211.25 | 266.85 |
| CAPACITOR 49 OMITTED | −70 | −65 | −58 |
| CAPACITOR 49 INCLUDED | −76 | −77 | −72 |

The distortion, as expected, is substantially increased in the case where capacitor 49 is disconnected but the distortion with the feedback capacitor is still extremely low, being only a few db worse than for the case with a nominally balanced amplifier.

An additional test was made on four amplifiers similar to that used to obtain the data of Tables 1 and 2. In this case the test was made on only one channel (channel 13, 211.25 MHZ) but was made under conditions of no feedback, feedback through resistor 45, and feedback through both resistor 45 and capacitor 49. The results are shown in Table 3.

TABLE 3

| | SECOND ORDER DISTORTION (DB BELOW + 50 dbm V) | | | |
|---|---|---|---|---|
| AMPLIFIER NO. | 1 | 2 | 3 | 4 |
| NO FEEDBACK | −70 | −65.5 | −72 | −60 |
| RESISTOR 45 ONLY | −72 | −67 | −72.5 | −62.5 |
| RESISTOR 45 AND CAPACITOR 49 | −80 | −77.5 | −80 | −68.5 |

What has been described is a novel feedback circuit for reducing second order distortion products in push-pull amplifiers. The invented circuit has been found to be useful in broad band R.F. applications such as CATV repeater amplifiers but the invention is susceptible to modification and adaptation as will occur to one skilled in the art and it is intended that such modifications and/or adaptations be within the spirit of the invention as claimed in the appended claims.

I claim:

1. A push-pull amplifier which comprises:

a. a pair of amplifiers;

b. input signal coupling means for coupling an input signal to the input of each of said amplifiers, the input signal as coupled to one of said amplifiers being of opposite polarity with respect to the input signal as coupled to the other of said amplifiers;

c. output signal coupling means coupled to the outputs of said amplifiers whereby an output signal which is a function of the difference in outputs of said amplifiers is obtained;

d. summing means coupled to both of said amplifiers, said summing means providing a signal which is a function of the sum of the outputs of said amplifiers; and e. feedback means coupled to said summing means and coupling a feedback signal from said summing means to the input of each of said amplifiers.

2. A push-pull amplifier as recited in claim 1 where said input signal coupling means is an input transformer.

3. A push-pull amplifier as recited in claim 1 and further including an output transformer, the primary of said output transformer being coupled to the outputs of said pair of amplifiers and said feedback signal being derived from the center tap of the primary of said output transformer.

4. A push-pull amplifier as recited in claim 1 where said pair of amplifiers are cascode amplifiers.

5. A push-pull amplifier as recited in claim 4 where said cascode amplifiers each comprise a common emitter connected transistor stage followed by a common base connected transistor stage.

6. A push-pull amplifier as recited in claim 5 where the bases of said common base connected stages are coupled and said feedback signal is derived from the circuit coupling said bases.

7. A push-pull amplifier as recited in claim 6 where said means for coupling a feedback signal to the inputs of said amplifiers couples the bases of said common base connected stages to the bases of said common emitter connected stages.

8. A push-pull connected amplifier as recited in claim 7 where said means for coupling a feedback signal includes a resistive/capacitor network.

9. A push-pull amplifier as recited in claim 1 where said feedback signal is proportional to the sum of the outputs of said amplifiers.

10. A push pull amplifier as recited in claim 1 where each of said pair of amplifiers inverts the polarity of the signal applied to the input of said amplifier.

11. A push pull amplifier which comprises:

a. a first pair of transistors;

b. input coupling means for coupling an input signal to the base of each of said first pair of transistors, said input coupling means coupling said input signal to the base of one of said first pair of transistors with a polarity opposite to that coupled to the other said first pair of transistors;

c. a second pair of transistors, the emitters of said second pair of transistors being coupled to the collectors of said first pair of transistors;

d. output coupling means coupled to the collectors of said second pair of transistors; and e. feedback means coupled to the bases of said second pair of transistors, said feedback means coupling a signal having a predetermined relationship to the sum of the signals at the bases of said second pair of transistors to the bases of said first pair of transistors.

* * * * *